United States Patent [19]
Sporck et al.

[11] Patent Number: 5,631,567
[45] Date of Patent: May 20, 1997

[54] PROCESS FOR PREDICTING PROPAGATION DELAY USING LINEAR INTERPOLATION

[75] Inventors: Nicholas Sporck, Saratoga; Chris Day, Mt. View, both of Calif.

[73] Assignee: LSI Logic Corporation, Milpitas, Calif.

[21] Appl. No.: 545,954

[22] Filed: Oct. 20, 1995

[51] Int. Cl.⁶ .................................................. G04F 8/00
[52] U.S. Cl. .................... 324/617; 324/532; 368/120; 327/37
[58] Field of Search .................. 327/37; 368/120, 368/121; 324/532, 617, 621; 437/8

[56] References Cited

U.S. PATENT DOCUMENTS

| | | | |
|---|---|---|---|
| 4,870,629 | 9/1989 | Swerlein | 368/120 |
| 5,381,100 | 1/1995 | Hayashi | 324/617 |
| 5,459,402 | 10/1995 | Ueno | 324/617 |
| 5,488,309 | 1/1996 | Farwell | 324/617 |
| 5,513,152 | 4/1996 | Cabaniss | 368/120 |

*Primary Examiner*—Kenneth A. Wieder
*Assistant Examiner*—Jose M. Solis
*Attorney, Agent, or Firm*—Bardghle, Pagenberg, Dost, Altenburg, Frohwitter, Geissler and Partners

[57] ABSTRACT

According to the present invention, a process for use with automatic test equipment ("ATE") for determining a propagation delay in a semiconductor circuit is provided. In one embodiment of the invention, the process comprises the steps of determining an expected delay time by interpolating a first simulation capacitance, a second simulation capacitance, and an ATE capacitance, with a first simulated delay time and a second simulated delay time, the simulated delay times corresponding to the first and second simulated capacitances respectively, testing the semiconductor circuit with the ATE to determine an ATE delay time, and comparing the ATE delay time with the expected delay time to determine whether the propagation delay is acceptable.

12 Claims, 4 Drawing Sheets

PROCESS FOR PREDICTING PROPAGATION DELAY USING LINEAR INTERPOLATION

BACKGROUND OF THE INVENTION

The present invention relates to testing semiconductor devices, and more particularly, to the use of automatic test equipment ("ATE") for predicting propagation delay.

Semiconductor devices, or integrated circuits, are susceptible to a wide variety of defects at all stages of their manufacture. Therefore, before semiconductor circuits are shipped to the consumer, they are tested. One tested parameter is propagation delay. The propagation delay generally refers to the time required for a signal to travel through a given circuit path and is particularly important in testing CMOS devices. Each semiconductor device contains a number of circuits which are tested in connection with their propagation delay. Unless the propagation delay falls within a certain acceptable range, the device is considered defective and is not shipped to the consumer.

Automatic test equipment useful for testing the propagation delay of a device is commercially available. Examples of useful equipment are the STS6120, STS8256, Vista LT and Vista Logic, all manufactured by Credence Systems Corporation. Other suitable ATE is also available, and additional examples will occur to those skilled in the art.

However, one problem encountered with all such automatic test equipment is that the equipment itself presents a capacitive load, especially to the output stages of the device being tested, which will affect the measurements made on the device. Therefore, it is necessary that the capacitive load presented by the ATE be taken into consideration when the result of the propagation delay measurements are analyzed.

In order to predict the effects of the capacitive load presented by the ATE on the device being tested, it is necessary to run computer simulations for the device with the same capacitive load as the tester in question placed on the output circuits of the device. Methods and equipment for running such simulations are known to those of skill in the art. However, for purposes of the present discussion, it is sufficient to state that running such a simulation is an expensive and time-consuming task.

The above-described problems are further compounded when it is considered that the capacitive load presented by the ATE varies from one tester to the next. Therefore, the test program generation for each ATE platform requires a separate simulation. This leads to production delays in testing semiconductor devices when a tester breaks down and another tester, for which no simulation has yet been made, must be used in its place, because testing must be halted until computer simulations are run for the device as loaded by the capacitance of the replacement tester.

Therefore, it is an object of the present invention to provide a solution to these, and other related problems in the art.

SUMMARY OF THE INVENTION

According to the present invention, a process is provided for use with automatic test equipment for propagation delay testing of a semiconductor circuit. In one embodiment, the process comprises providing an input signal to the semiconductor device, receiving an output signal, responsive to the input signal, from the semiconductor device, measuring a time period between providing the input signal and receiving the output signal to determine an actual propagation delay time, interpolating a first simulated capacitance, a second simulated capacitance and an ATE capacitance with a first simulated delay time and a second simulated delay time, the simulated delay times corresponding to the first and second simulated capacitances respectively, whereby an expected propagation delay time is determined, and generating a device acceptance signal responsive to the actual propagation delay time and the expected propagation delay time. According to another aspect, the process comprises comparing the actual propagation delay time and the expected propagation delay time to determine whether the semiconductor device is acceptable.

BRIEF DESCRIPTION OF THE DRAWINGS

For a more complete understanding of the invention and for further advantages thereof, references made to the following detailed description taken in conjunction with the accompanying drawings, in which.

It is to be noted, however, that the appended drawings illustrate only typical embodiments of this invention and are therefore not to be considered limiting of its scope, for the invention may admit to other equally effective embodiments.

DETAILED DESCRIPTION OF EMBODIMENTS OF THE INVENTION

Figure 1:
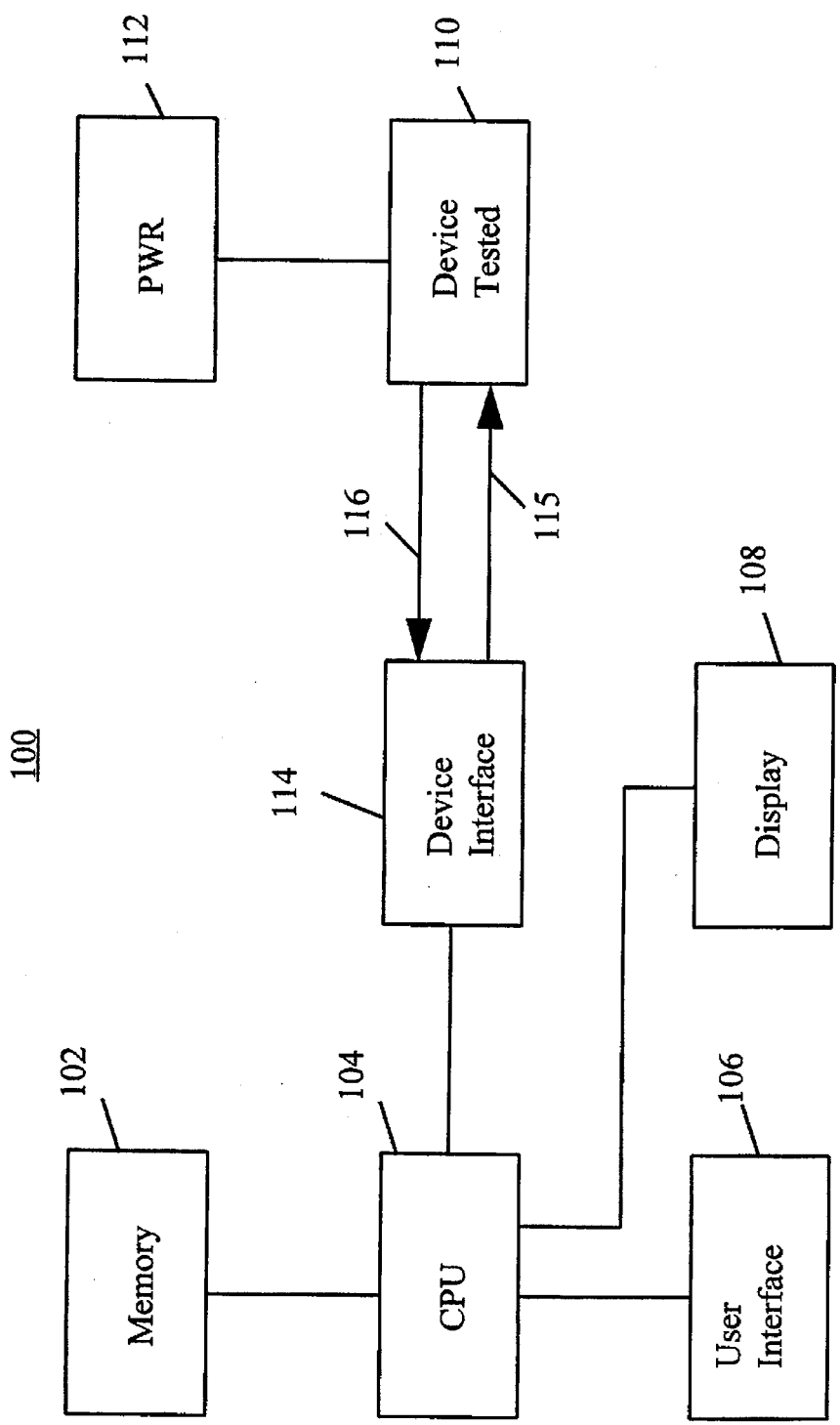
FIG. 1 is a block diagram of a tester useful with the present invention.

Referring now to FIG. 1, a process is provided, according to one embodiment of the present invention, for use with automatic test equipment for determining a propagation delay in a semiconductor circuit. FIG. 1 shows a block diagram of a tester 100 useful with embodiments of the invention. The tester 100 comprises a memory 102 accessible by a central processing unit ("CPU") 104. The CPU 104 has a display 108 for providing information to an operator relating to the testing of the device 110 as well as status, programming and operation information concerning the tester itself. CPU 104 also has a user interface 106 which allows an operator to program and control the tester. The tester 100 also comprises a power supply 112 which is used to power up the device to be tested 110.

After a computer simulation has been performed for the device to be tested, the results of the simulation are compiled into a test program which is loaded in the memory 102 of the tester 100. The test program is then executed by the CPU 104 which, in accordance with the test program, provides input signals 115 and records output signals 116, from the device 110 via the device interface 114. The output signals 116 received from the device 110 in response to the input signals 115 are processed by the CPU 104 then stored in memory 102 and/or displayed on display 108. By viewing the results on display 108, an operator decides whether the device has passed the required tests or is defective. Of course, other embodiments are possible in which the CPU 104 decides, based on parameters stored in memory 102, whether the device is defective, and takes appropriate action without any interference from an operator.

In one embodiment, the input signal 115 causes an output signal 115 which is received at the device interface 114 and provided to CPU 104. The CPU 104 then determines the actual propagation delay time by measuring the time period, i.e., the time elapsed between providing the input signal 115 to the device 110 and the receipt of the output signal 116 at the interface 114. In this version, the actual propagation delay time represents the time required for the input signal to propagate through a circuit path in the semiconductor device.

Of course, as stated previously, this propagation delay time is dependent, not only on the semiconductor circuit itself, but also on the capacitive loading of the automatic test equipment which is used to measure the propagation delay time. Therefore, before the actual propagation delay time is used to determine whether the device is acceptable, the effect of the capacitive loading must be taken into account.

Therefore, according to another embodiment of the invention, a process is provided which comprises determining an expected propagation delay time by interpolating, or extrapolating, a first simulated capacitance, a second simulated capacitance, and an ATE capacitance with a first simulated delay time and a second simulated delay time, the simulated delay times corresponding to the first and second simulated capacitances respectively. This embodiment of the invention is described more fully with respect to FIG. 2.

Figure 2:
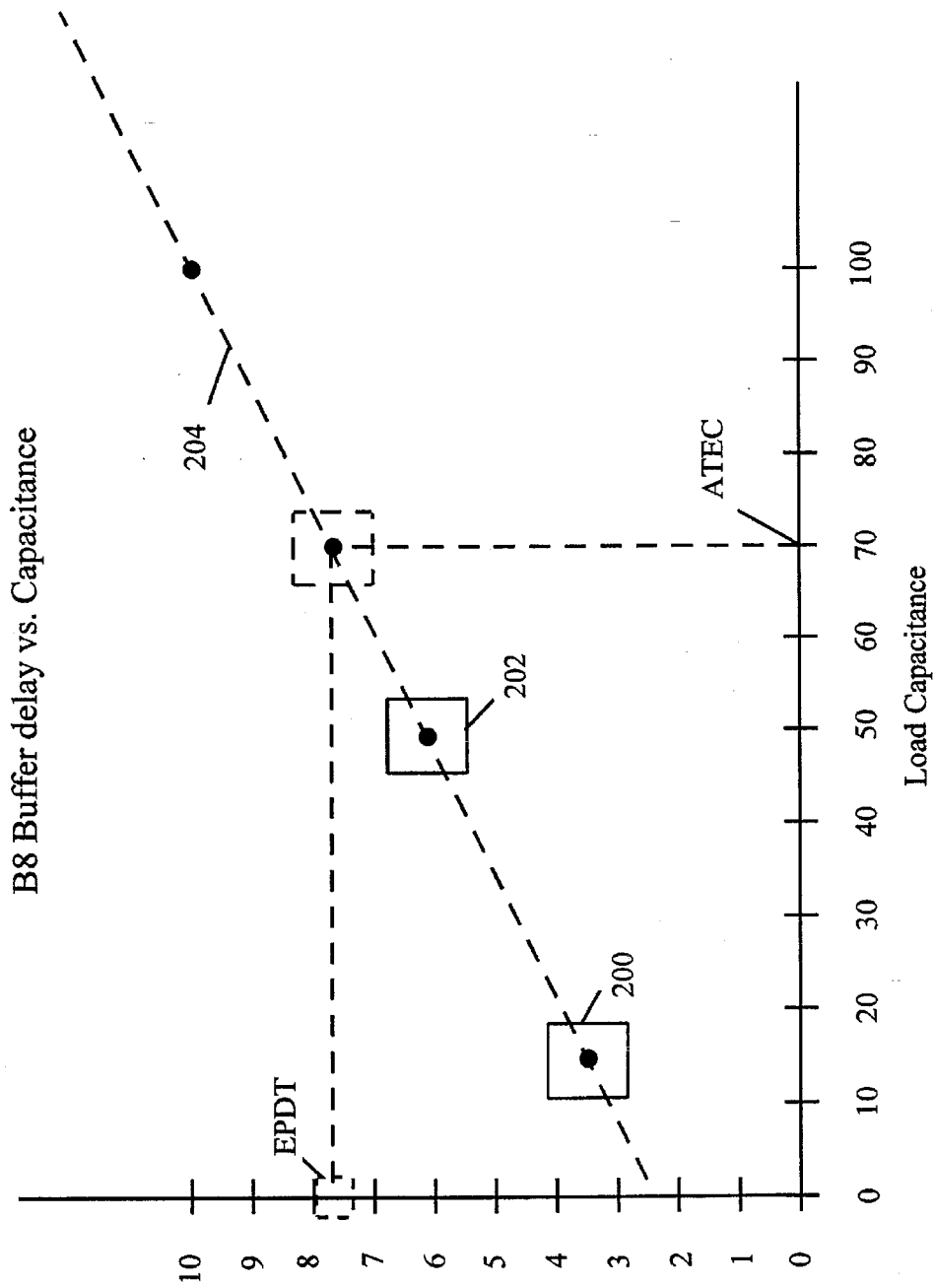
FIG. 2 is a graph indicating the relationship between the propagation delay and the capacitive load in an example circuit used with the present invention.
Figure 3:
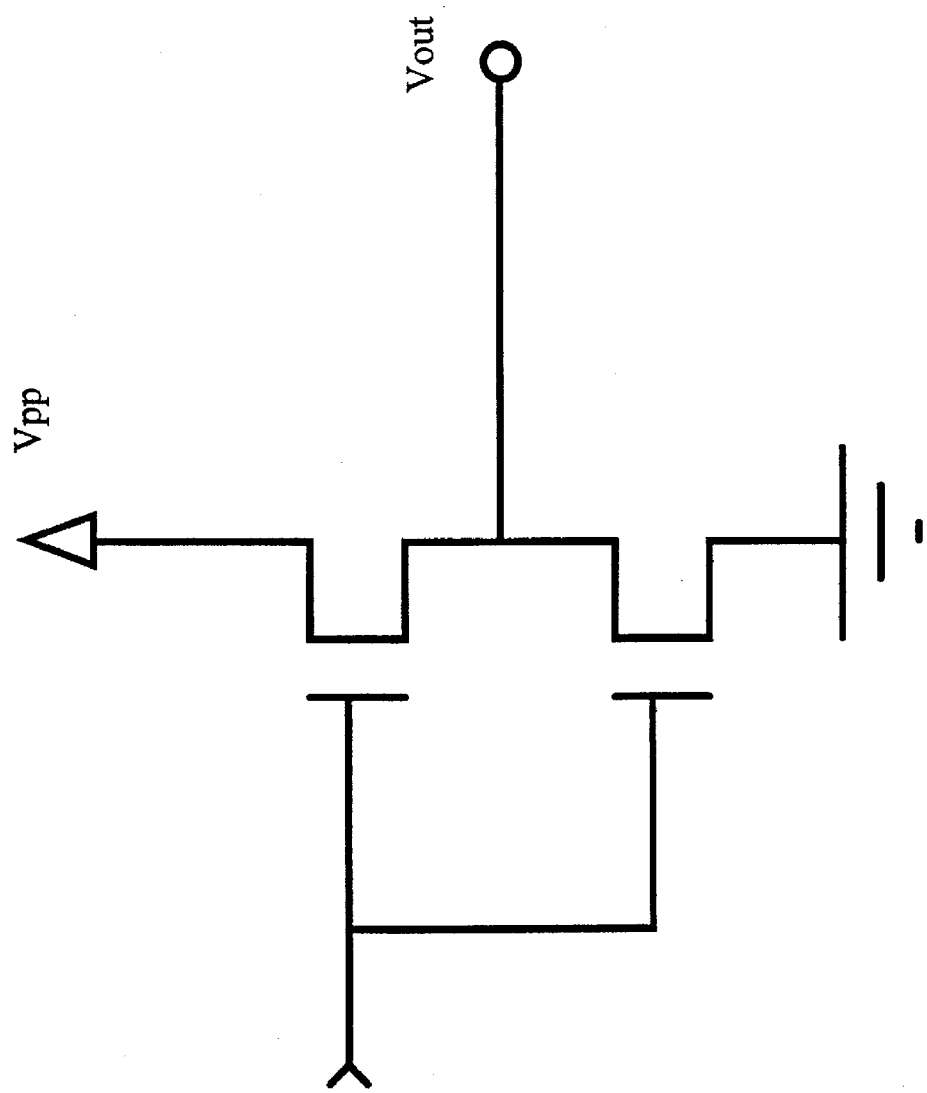
FIG. 3 is a schematic diagram of the circuit having the propagation delay/capacitive load relationship as indicated in FIG. 2.

FIG. 2 shows a graph of the propagation delay time versus the simulated capacitance load of an example semiconductor circuit, in this case, the CMOS buffer circuit as shown in FIG. 3. In this particular embodiment, four computer simulations were run assuming a capacitive load on the circuit of 15, 50, 85 and 100 picofarads respectively. The vertical axis represents the expected propagation delay time of a good device. The horizontal axis represents the simulated capacitive load.

As seen from the graph, as the capacitive load increases, so does the propagation delay such that, at a load of 15 picofarads, the expected propagation delay of a good circuit would be 3.5 nanoseconds, and at a load of 100 picofarads, the expected propagation delay time would be 10 nanoseconds. However, in this example, it is seen that no computer simulation has been run for a simulated load of 70 picofarads. Therefore, absent the present invention, if the device is to be tested on a tester having a 70 picofarad load, it would be necessary to first run a fifth computer simulation at this load.

This version of the invention recognizes that the increase in propagation delay time associated with the increase in load capacitance is a function of the change in the RC time constant when the device is loaded. Thus, the propagation delay time will increase linearly with respect to the increase in the load capacitance. Therefore, it is possible to determine the propagation delay time for a 70 picofarad load based upon linear interpolation of the results of previous simulations.

For example, for a simulated load capacitance of 15 picofarads, the propagation delay of a commercially acceptable device is 3.5 nanoseconds. At a simulated capacitive load of 100 picofarads, the propagation delay of the same device is 10 nanoseconds. Therefore, if a device is to be tested on an ATE with a capacitance of 70 picofarads, then the expected propagation delay would be:

$$\frac{70-15}{100-15} = \frac{x-3.5}{10-3.5}$$

where x represents the propagation for a good device at a 70 picofarad load. Solving for x yields an expected propagation delay time of 7.71 nanoseconds. If the actual propagation delay time measured falls outside of a certain range of this value, then the device is considered defective and disposed of accordingly.

Although linear interpolation was used to determine the expected propagation delay time in the above example, those of skill in the art will recognize that the expected propagation delay time could also have been determined by extrapolation. For example, referring again to FIG. 4, in another embodiment of the invention points 200 and 202 are used to mathematically define a line 204. Once the equation for line 204 is determined, well understood techniques of analytical geometry are employed to extrapolate the expected propagation delay time from a corresponding load capacitance. Moreover, it is to be understood that, in other embodiments, the invention is not limited to linear extrapolation techniques, but is employed with non-linear techniques, such as curve fitting, using mathematical techniques commonly known to those of skill in the art. These non-linear techniques are most useful when, due to various electrical parameters, the relationship between the load capacitance and the propagation delay is non-linear, and approximations using linear techniques do not provide sufficient accuracy.

Figure 4:
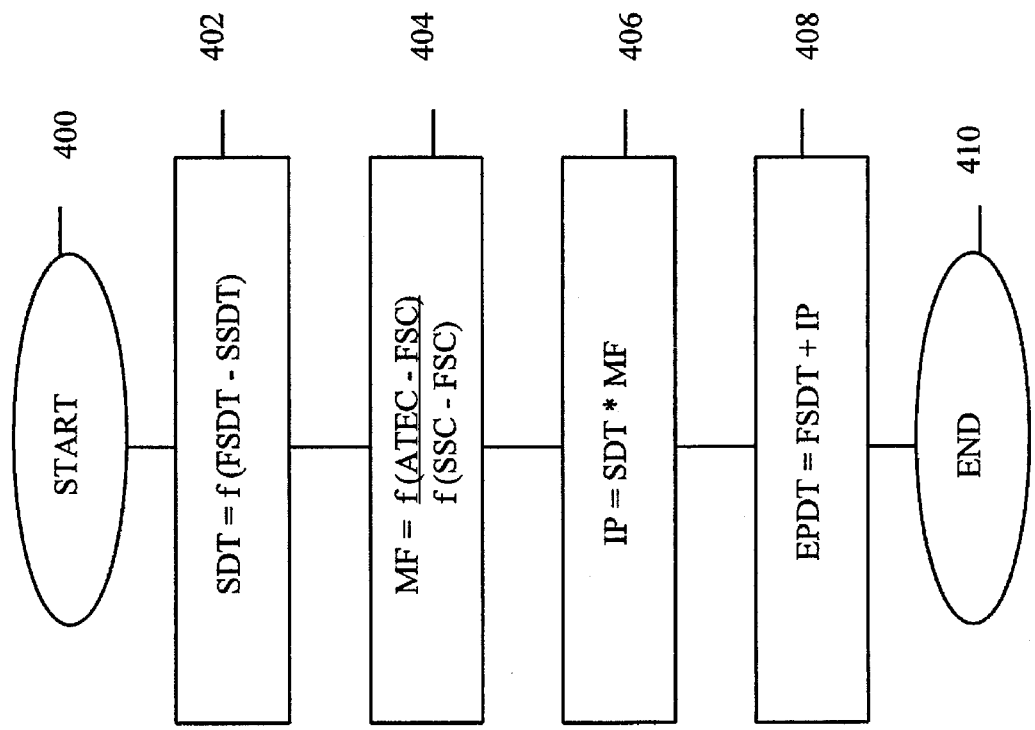
FIG. 4 is a flow chart according to one embodiment of the invention.

Of course, the step of interpolation lends itself to a solution by a computer. FIG. 4 is a flow chart for a software program useful with one embodiment of the invention. Once the program is initiated in step 400, flow passes to step 402 which defines a simulated delay time and "SDT" dependent upon a difference between the first simulated delay time ("FSDT") and the second simulated delay time ("SSDT"). Once the simulated delay time is defined, flow passes to step 404 in which a multiplication factor ("MF") is defined by dividing a difference between the ATE capacitance ("ATE") and the first simulated capacitance ("FSC") by the difference between the second simulated capacitance ("SSC") and the first simulated capacitance. Next, an intermediate product ("IP") is defined by multiplying the simulated delay time by the multiplication factor. Flow is then passed to step 408 in which the expected propagation delay time ("EPDT") is determined by adding the first simulated delay time to the intermediate product. It is to be understood that this is only one embodiment of a program useful with the present invention, and that other suitable algorithms will occur to those of skill in the art.

The above-described circuit and delay versus load relationship is merely one specific embodiment of the present invention, and the invention is useful with any circuit having a known relationship between a load and the propagation delay time. For example, the above invention has been described with respect to linear interpolation and/or extrapolation. However, if the relationship between the load and the propagation delay is non-linear, then non-linear interpolation, extrapolation, or curve fitting, is useful with the present invention as long as the relationship between the load and the propagation delay is known. Suitable techniques are known to those of skill in the art.

After the interpolation, or extrapolation, is complete, one version of the invention subsequently includes generating a device acceptance signal responsive to the actual propagation delay time and the expected propagation delay time. It is understood that the step of generating a device acceptance signal is not critical and many suitable embodiments will occur to those of skill in the art. For example, the device acceptance signal may be determined by comparing the actual propagation delay and the expected propagation delay time. If the actual propagation delay time falls within an acceptable range of the expected propagation delay time, then the device is considered good. If not, the device is considered defective. The acceptability of the device is communicated to the operator of the automatic test equipment by the device acceptance signal. Those of skill in the art will recognize that the device acceptance signal may take numerous forms according to different versions of the invention. For example, in one version, the device acceptance signal is a signal from the CPU to the display which causes the display to indicate the status of the device. Also, in another version, the device acceptance signal operates an automated production line which disposes of defective devices without interference from the operator. Additional variations within the scope of the present invention will occur to those of skill in the art.

What is claimed is:

1. A process for use with automatic test equipment ("ATE") for propagation delay testing of a semiconductor circuit, the process comprising:

providing an input signal to the semiconductor device;

receiving an output signal, responsive to the input signal, from the semiconductor device;

measuring a time period between providing the input signal and receiving the output signal to determine an actual propagation delay time;

finding an expected propagation delay time dependant upon a first simulated capacitance, a second simulated capacitance, an ATE capacitance, a first simulated delay time, and a second simulated delay time, the simulated delay times corresponding to the first and second simulated capacitances respectively;

generating a device acceptance signal responsive to the actual propagation delay time and the expected propagation delay time.

2. A process as in claim 1 wherein generating a device acceptance signal comprises:

comparing the actual propagation delay time with the expected propagation delay time to determine whether the actual propagation delay time falls within a predetermined range of the expected propagation delay time.

3. A process as in claim 2, wherein comparing the actual propagation delay time and the expected propagation delay time comprises subtracting the expected propagation delay time from the actual propagation delay time.

4. A process as in claim 1 wherein finding comprises non-linear interpolation.

5. A process as in claim 1 wherein finding comprises linear interpolation.

6. A process as in claim 5 wherein said finding comprises:

defining a simulated delay time dependant upon a difference between the first simulated delay time and the second simulated delay time;

defining a multiplication factor by dividing a difference between the ATE capacitance and the first simulated capacitance by the difference between the second simulated capacitance and the first simulated capacitance;

defining an intermediate product by multiplying the simulated delay time by the multiplication factor;

determining the expected propagation delay time by adding the first simulated delay time to the intermediate product.

7. A process as in claim 1 wherein finding comprises extrapolation.

8. A process as in claim 7 wherein the extrapolation is non-linear.

9. A process as in claim 1 wherein the first simulated capacitance is between about 0 and about 100 picofarads.

10. A process as in claim 9 wherein the first simulated capacitance is between about 10 and about 15 picofarads.

11. A process as in claim 1 wherein the second simulation capacitance is between about 0 and about 100 picofarads.

12. A process as in claim 11 wherein the second simulated capacitance is between about 10 and about 15 picofarads.

* * * * *